United States Patent
Wu

(10) Patent No.: US 6,809,932 B2
(45) Date of Patent: Oct. 26, 2004

(54) COVER APPARATUS FOR DISSIPATING HEAT AND SHIELDING ELECTROMAGNETIC INTERFERENCE

(75) Inventor: Kuo-Tai Wu, Taipei (TW)

(73) Assignee: Accton Technology Corporation (TW)

( * ) Notice: Subject to any disclaimer, the term of this patent is extended or adjusted under 35 U.S.C. 154(b) by 0 days.

(21) Appl. No.: 10/453,543

(22) Filed: Jun. 4, 2003

(65) Prior Publication Data
US 2004/0160743 A1 Aug. 19, 2004

(30) Foreign Application Priority Data
Feb. 19, 2003 (TW) ........................................ 92103466 A

(51) Int. Cl.[7] ................................................ H05K 7/20
(52) U.S. Cl. ........................ 361/719; 361/704; 361/707; 174/16.1; 165/80.3; 165/185
(58) Field of Search ................................ 361/688–690, 361/704, 707, 719; 174/16.1, 16.3; 165/80.3, 185

(56) References Cited

U.S. PATENT DOCUMENTS

| | | | | |
|---|---|---|---|---|
| 5,991,155 A | * | 11/1999 | Kobayashi et al. | 361/705 |
| 6,025,991 A | * | 2/2000 | Saito | 361/704 |
| 6,034,874 A | * | 3/2000 | Watanabe | 361/704 |
| 6,043,981 A | * | 3/2000 | Markow et al. | 361/704 |
| 6,101,092 A | * | 8/2000 | Onishi | 361/705 |
| 6,134,112 A | * | 10/2000 | LeCornu et al. | 361/720 |
| 6,498,726 B2 | * | 12/2002 | Fuller et al. | 361/704 |
| 6,545,871 B1 | * | 4/2003 | Ramspacher et al. | 361/709 |
| 6,618,252 B2 | * | 9/2003 | Choi | 361/719 |
| 2003/0184976 A1 | * | 10/2003 | Brandenburg et al. | 361/719 |

FOREIGN PATENT DOCUMENTS

EP 340520 A2 * 11/1989 ............ H05K/7/20

* cited by examiner

Primary Examiner—Boris Chérvinsky

(57) ABSTRACT

A cover apparatus for a plug-in interface card is provided. The cover apparatus comprises a plate, which secures on a circuit board of a wireless local area network (WLAN) card. The plate has at least one concave corresponding to a chip on the WLAN card. The concave directly or indirectly contacts the chip to dissipate heat. The cover apparatus also comprises a fastener installed near the chip to fix the plate on the circuit board. By the concave and the fastener, the plate is able to not only shield electromagnetic interference (EMI) but also dissipate heat from the chip.

16 Claims, 3 Drawing Sheets

COVER APPARATUS FOR DISSIPATING HEAT AND SHIELDING ELECTROMAGNETIC INTERFERENCE

BACKGROUND OF THE INVENTION

1. Field of Invention

The invention relates to a cover apparatus and, in particular, to a cover apparatus for wireless local area network (WLAN) cards.

2. Related Art

The electronic information industry has prospered in recent years. The use of many electronic information products also become popular. With the trend of compactness, the unnecessary voltage or current among internal systems of the products generates enormous broadband noises, which seriously affect the functions of the device. This phenomenon is generally referred as electromagnetic interference (EMI). The EMI problem inside the computer is very complicated. The interference sources include the central processing unit (CPU), motors, inverters, relays, switches, transistors, amplifiers, power supplies or other alternate circuits.

Generally speaking, to solve the EMI problem in electronic information products such as the wireless local area network (WLAN) cards, a conventional way is to use an electromagnetic (EM) shielding material to absorb or shield the EM waves. The shielding of electric field is done by disposing an electric field shielding material between two regions. The separate charges in the electric field shielding material produces a shielding effect, preventing the electric field in one region from propagating to the other. Under a high-frequency electric field, one may use materials with larger permittivity, such as metals, to make a plate cover to enclose electronic elements to be protected.

In the WLAN standards IEEE 802.11, the IEEE 802.11a transmission speed can reach as high as 54 Mbps so that it can have wider applications. IEEE 802.11a can effectively reduce multiple path attenuation and select the 5.4 GHz bandwidth with less interference. These advantages are superior to the currently used 802.11b standards (which uses a bandwidth of 2.4 GHz and has a transmission speed of 11 Mbps). Along with the advance in production techniques and the demands for larger bandwidths and higher speeds, IEEE 802.11a is seen as the high-speed WLAN standards in the next generation.

However, since the IEEE 802.11a transmissions speed and bandwidth are higher than those of IEEE 802.11b, the broadband chip for the IEEE 802.11a standards has a higher power consumption. Poor heat dissipation often affects the operation of the broadband chip. Moreover, such high-frequency electronic devices need a cover apparatus to prevent the EMI problem. Currently, conventional metal plate cover apparatuses can only shield the EM field and cannot simultaneously provide good heat dissipation.

SUMMARY OF THE INVENTION

An objective of the invention is to provide a cover apparatus for plug-in interface cards to simultaneously provide good heat dissipation and prevent EMI.

Pursuant to the above objective, the disclosed cover apparatus contains a plate, which secures on a circuit board of a plug-in interface card. The plate has at least one concave corresponding to a chip. The concave directly or indirectly contacts the chip to dissipate heat. The cover apparatus also comprises a fastener to secure the plate on the circuit board. By the concave and the fastener, the plate is able to not only shield electromagnetic interference (EMI) but also dissipate heat from the chip.

According to a preferred embodiment of the invention, the fastener secures the plate on the circuit board using nuts and bolts. A clip device and sidewalls are further employed to enhance the fixing of the plate on the circuit board, providing better EMI shielding. The material of the plate, the fastener, the clip device, and sidewalls is a metal or conductive plastic. In addition, a thermal conductive material can be disposed between the concave and the chip-contacted surface, enhancing the thermal conductivity in between.

In addition to EM shielding, the disclosed cover apparatus further utilizes the concave and the fastener to achieve heat dissipation. The invention uses several devices to secure the plate onto the WLAN card, which do not only prevent bad EM shielding and heat dissipation due to ill-assembly but also avoid the exposure of electronic components to protect the WLAN card.

BRIEF DESCRIPTION OF THE DRAWINGS

These and other features, aspects and advantages of the invention will become apparent by reference to the following description and accompanying drawings which are given by way of illustration only, and thus are not to be limiting of the invention, and wherein.

DETAILED DESCRIPTION OF THE PREFERRED EMBODIMENT

To improve the function of the cover apparatus in the conventional WLAN cards, the invention proposes a cover apparatus with the functions of heat dissipation and EMI shielding.

Figure 1A:
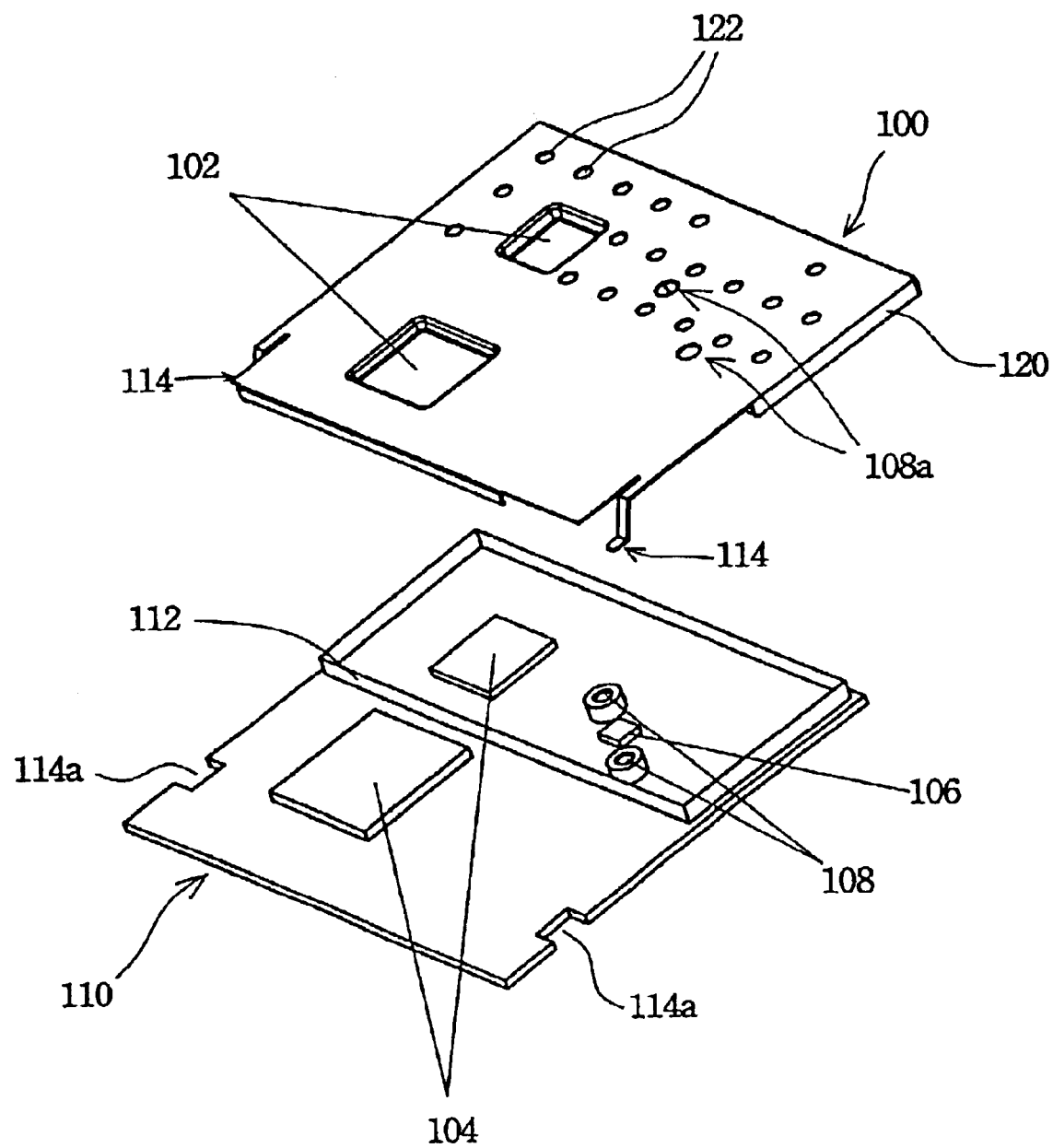
FIG. 1A is a schematic view of a preferred embodiment of the invention.

With reference to FIG. 1A, the circuit board 110 of the IEEE 802.11a WLAN card has a chip 104 producing much heat and another chip 106 producing even much heat. The plate 100 of the invention covers the chip 104 and the chip 106 on the circuit board 110 and has sidewalls 120. The sidewalls 120 extend a certain distance from the border of the plate 100 toward the chips by substantially 90 degrees, covering the peripheral area of the circuit board 110.

The position on the plate 100 corresponding to the chip 104 has a concave 102. To enhance the heat transmission effect, the lower surface of the concave 102 can directly touch the surface of the chip 104. A thermal conductive material such as the thermal conductive grease can be applied between the surface of the chip 104 and the plate 100 to lower the thermal contact resistance in between.

Figure 1B:
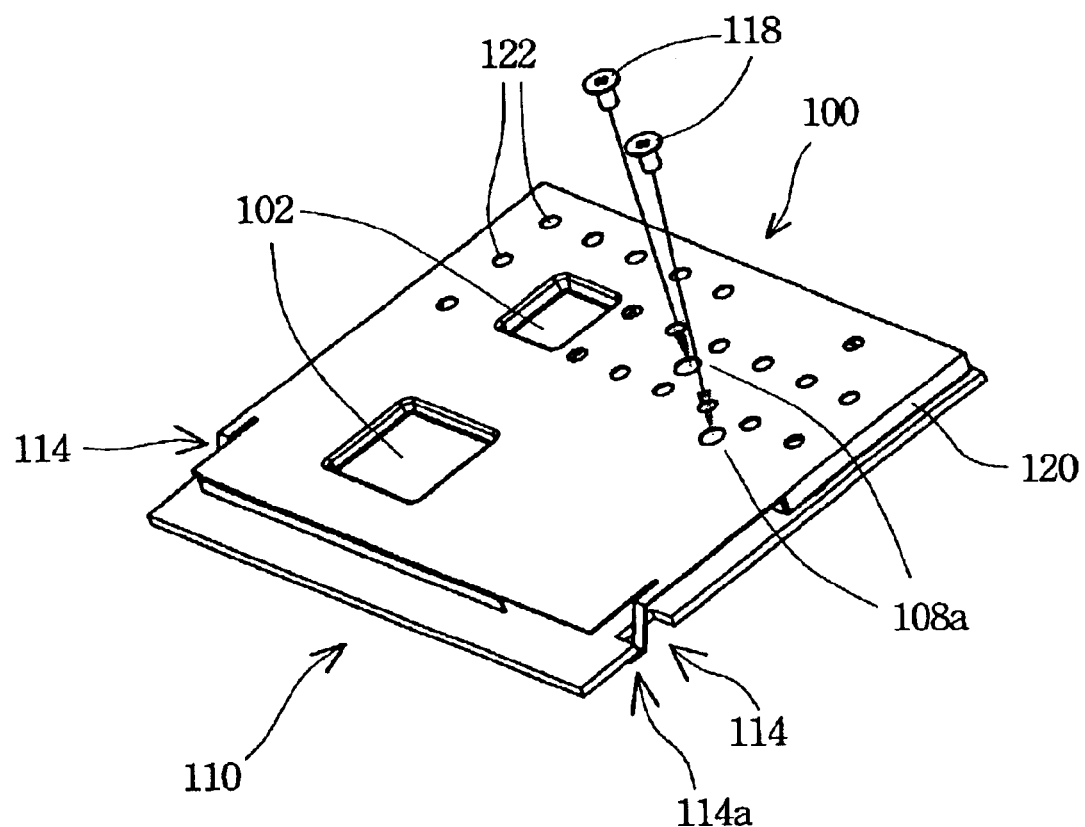
FIG. 1B is a schematic view of the assembled apparatus in FIG. 1A.

According to a preferred embodiment of the invention, the circuit board 110 of the WLAN card is further installed with bosses 108 and fencings 112. The bosses 108 are installed near the chip 106. As shown in FIG. 1B, screws 118 are used to fasten the plate 100 on the circuit board 110 through the screw holes 108a. Securing the plate 100 on the circuit board 110 can increase the stress between the plate 100 and the chip 104, thereby decreasing the thermal contact resistance between the plate 100 and the chip 104. Accordingly, the heat dissipation efficiency can be greatly increased.

The fencings 112 and the sidewalls 120 can be tightly combined together. In addition to increasing the electromagnetic interference (EMI) shielding effect, they also have the function for fastening the plate 100. In the current embodiment, the plate 100 further contains a engaging mechanism 114, which secures the plate 100 onto the circuit board 110 via the opening 114a. The engaging mechanism 114 is an L-shape structure installed along the peripheral of the plate 100 and having a first segment and a secondsegment The first segment of the engaging mechanism 114 is connected to the plate 100 and goes through the opening 114a on the circuit board 110, so that the second segment reaches the other surface of the circuit board 110 to assembly the plate 100 and the circuit board 110. The plate 100, the engaging mechanism 114, and the sidewalls 120 can be formed as a whole in one manufacture process to reduce the production cost.

Figure 1C:
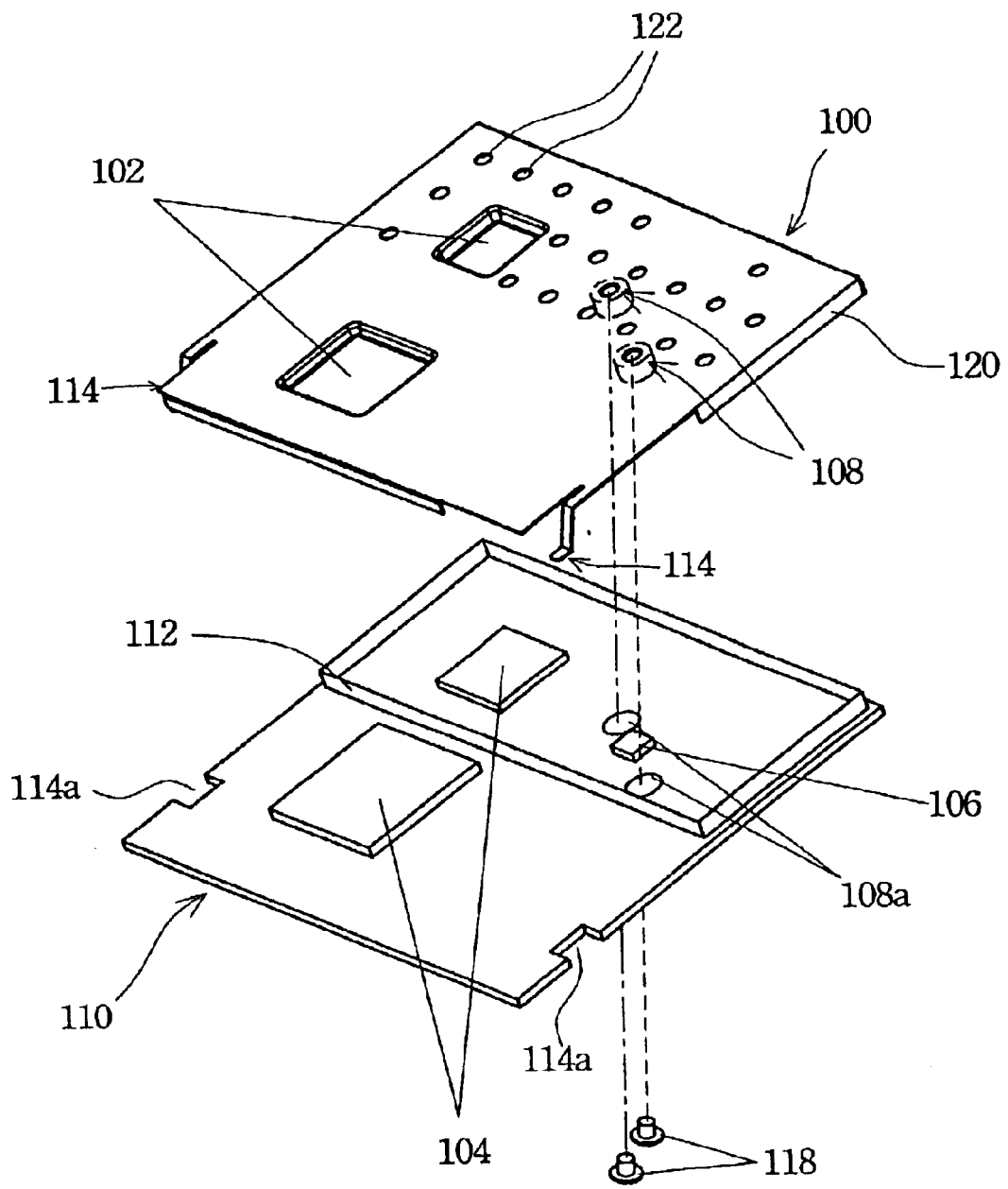
FIG. 1C is a schematic view of another preferred embodiment of the invention.

According to a preferred embodiment of the invention, the plate 100, the bosses 108, the fencings 112, and the screws 118 are made of thermal conductive metals, such as copper and aluminum, or plastics that are both thermal and electric conductive, such as graphite fibers. All of them can provide well EMI shielding. The plate 100 is formed with several through holes 122. The heat produced by the chips is dissipated via fluid convection. Aside from the configuration introduced in the above-mentioned embodiment, the bosses 108 can be installed on the plate 100 too, as shown in FIG. 1C. The screw holes 108a are installed close to the chip 106. The screws 118 go through the screw holes 108a and grasp inside the bosses 108, securing the plate 100 onto the circuit board 110. Therefore, as long as the bosses 108 are close to the chip 106 to push the chip 106 and the plate 100 together, the thermal conductive resistance can be reduced to increase heat dissipation.

From the above preferred embodiment, one sees that the invention has the following advantages:

1. In addition to the EMI shielding effect, the cover apparatus of the invention uses its concave and fastener to achieve heat dissipation. The lower surface of the concave directly or indirectly touches the chip to dissipate its heat. Moreover, a thermal conductive material, such as thermal conductive grease, can be disposed between the lower surface of the concave and the chip to enhance heat dissipation. The lower surface of the concave and the chip can be in direct contact to reduce the heat resistance. The screws and the bosses are installed near the chips to press the chips tightly against the plate. In this manner, the heat produced by the broadband chip with another standard can be dissipated efficiently.

2. The invention uses several devices to assembly the cover apparatus and the WLAN card. In addition to avoid poor EMI shielding and heat dissipation effect due to the ill-assembly of its components, the invention can further prevent the electronics from being exposed to the environment, thereby protecting the circuit board.

3. The disclosed cover apparatus can be applied to the WLAN card that requires good heat dissipation. Therefore, such WLAN cards can be used in personal computers, portable computers, WLAN equipment and wireless network access points.

Although the invention has been described with reference to specific embodiments, this description is not meant to be construed in a limiting sense. Various modifications of the disclosed embodiments, as well as alternative embodiments, will be apparent to persons skilled in the art It is, therefore, contemplated that the appended claims will cover all modifications that fall within the true scope of the invention.

What is claimed is:

1. A cover apparatus for a plug-in interface card that contains at least one circuit board with at least one chip, the cover apparatus comprising:
   a plate installed on the circuit board to cover the chip and with at least one concave directly or indirectly contacting with a surface of the chip for heat dissipation; and
   at least one fastener being installed near the chip on the circuit board for securing the plate onto the circuit board to enhance the heat dissipation from the chip.

2. The cover apparatus of claim 1, wherein a material of the plate and the fastener is selected from a group consisting of metal and thermal- and electric-conductive plastics.

3. The cover apparatus of claim 1, wherein a thermal conductive material is disposed between the concave and a surface of the chip opposite to the concave.

4. The cover apparatus of claim 1, wherein the plate comprises a engaging mechanism for securing the plate onto the circuit board, the engaging mechanism is a substantially L-shape structure with a first segment and a second segment, the first segment is secured to the plate and passes through an opening on the circuit board, so that the second segment touches a surface of the circuit board opposite to another surface with the chip.

5. The cover apparatus of claim 1, wherein the plate comprises a plurality of through holes.

6. The cover apparatus of claim 1, wherein the fastener is composed of at least a screw and a boss.

7. The cover apparatus of claim 1, wherein the plate contains at least one sidewall extending a predetermined distance from a fringe of the plate toward the chip by substantially 90 degrees.

8. The cover apparatus of claim 7 further comprising at least one fencing disposed on the circuit board for attaching to the sidewall and securing the plate onto the circuit board.

9. The cover apparatus of claim 4, wherein the plate and the engaging mechanism are formed as a whole.

10. A cover apparatus for a plug-in interface card that contains at least one circuit board with at least one chip, the cover apparatus comprising:
    a plate installed on the circuit board to cover the chip and with at least one concave directly or indirectly contacting with a surface of the chip for heat dissipation;
    at least one engaging mechanism for securing the plate onto the circuit board;
    at least one sidewall extending a predetermined distance from a fringe of the plate toward the chip by substantially 90 degrees;
    at least one fastener being installed near the chip on the circuit board for securing the plate onto the circuit board to enhance the heat dissipation from the chip; and
    at least one fencing disposed on the circuit board for attaching to the sidewall and securing the plate onto the circuit board.

11. The cover apparatus of claim 10, wherein a material of the plate and the fastener is selected from a group consisting of metal and thermal- and electric-conductive plastics.

12. The cover apparatus of claim 10, wherein a thermal conductive material is disposed between the concave and a surface of the chip opposite to the concave.

13. The cover apparatus of claim 10, wherein the plate comprises a engaging mechanism for securing the plate onto the circuit board, the engaging mechanism is a substantially L-shape structure and with a first segment and a second segment, the first segment is secured to the plate and passes through an opening on the circuit board, so that the second segment touches a surface of the circuit board opposite to another surface with the chip.

14. The cover apparatus of claim 10, wherein the plate comprises a plurality of through holes.

15. The cover apparatus of claim 10, wherein the fastener is composed of at least a screw and a boss.

16. The cover apparatus of claim 10, wherein the plate, the engaging mechanism, and the sidewall are formed as a whole.

* * * * *